United States Patent
Lai et al.

(10) Patent No.: US 8,502,617 B2
(45) Date of Patent: Aug. 6, 2013

(54) PRINTED CIRCUIT BOARD

(75) Inventors: Ying-Tso Lai, Tu-Cheng (TW);
Yung-Chieh Chen, Tu-Cheng (TW)

(73) Assignee: Hon Hai Precision Industry Co., Ltd., New Taipei (TW)

(*) Notice: Subject to any disclaimer, the term of this patent is extended or adjusted under 35 U.S.C. 154(b) by 414 days.

(21) Appl. No.: 13/015,889

(22) Filed: Jan. 28, 2011

(65) Prior Publication Data
US 2012/0154075 A1    Jun. 21, 2012

(51) Int. Cl.
*H01P 3/08*    (2006.01)

(52) U.S. Cl.
USPC .............................................. 333/5

(58) Field of Classification Search
USPC ........................ 333/1, 4, 5, 238, 33
See application file for complete search history.

(56) References Cited

U.S. PATENT DOCUMENTS
8,018,296 B2 *   9/2011   Li et al. .................. 333/5

* cited by examiner

*Primary Examiner* — Stephen Jones
(74) *Attorney, Agent, or Firm* — Altis Law Group, Inc.

(57) ABSTRACT

A printed circuit board includes a base, a signal layer lying on the base, and a number of pairs of differential signal traces positioned on the signal layer. The base is made of a grid of glass fiber bundles filled with epoxy resin. Each pair of differential signal traces includes a first signal trace and a second signal trace. Each of the first and second signal traces extends in a zigzag pattern. The first signal trace includes a number of wave crests and wave troughs. The wave crests define a reference straight line that connects all the wave crest of the first signal trace. The ratio of the distance from each wave crest to the reference straight line to the orthogonal distance between each wave crest and an adjacent wave trough along the reference straight line is 1:5.

5 Claims, 2 Drawing Sheets

PRINTED CIRCUIT BOARD

BACKGROUND

1. Technical Field

The present disclosure relates to a printed circuit board (PCB).

2. Description of Related Art

Many PCBs include a number of pairs of differential signal traces, each pair includes two signal traces extending in a straight line substantially parallel to each other. The two signal traces are laid on a base made of woven fiberglass, and filled with reinforcing epoxy resin. The fiberglass and the epoxy resin typically have different dielectric coefficients. The base is a non-uniform medium for signal transmission, which can cause a fiber-weave effect that adversely affects transmission performance of the signal traces.

Therefore, it is desirable to provide a printed circuit board which can overcome the limitations described.

BRIEF DESCRIPTION OF THE DRAWINGS

Many aspects of the present disclosure can be better understood with reference to the following drawings. The components in the drawings are not necessarily drawn to scale, the emphasis instead being placed upon clearly illustrating the principles of the present disclosure. Moreover, in the drawings, like reference numerals designate corresponding parts throughout the views.

DETAILED DESCRIPTION

Embodiments of the present disclosure will now be described in detail with reference to the drawings.

Figure 1:
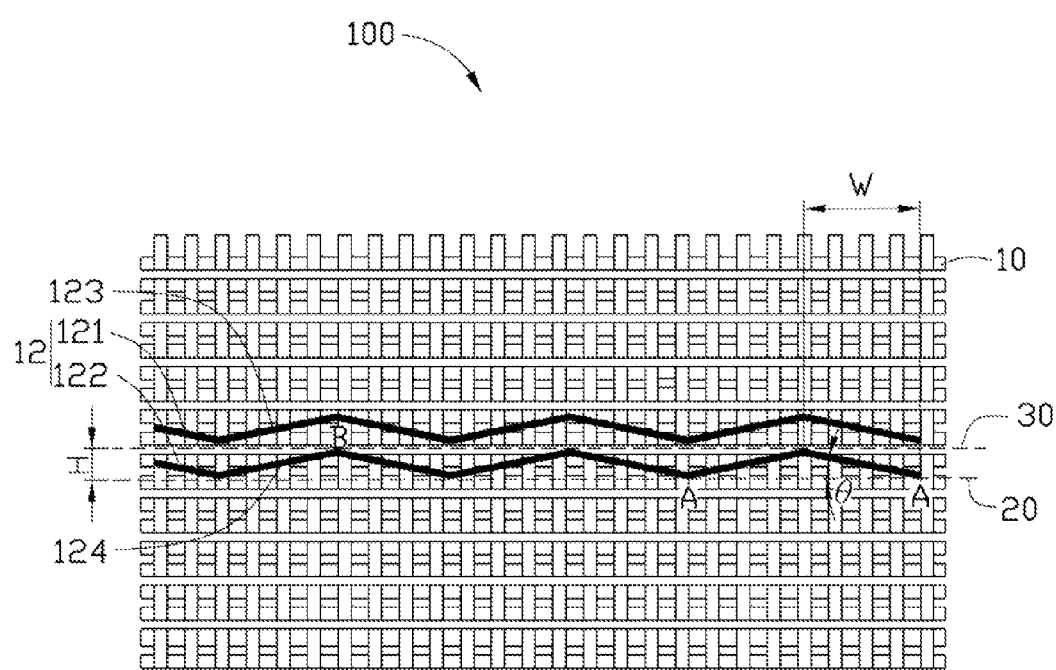
FIG. 1 is a schematic view of a printed circuit board according to one embodiment.
Figure 2:
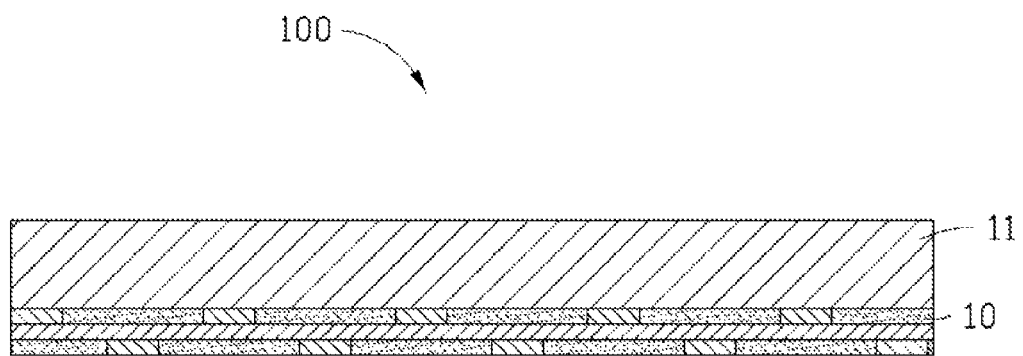
FIG. 2 is a cross-segmental, schematic view of the printed circuit board of FIG. 1.

Referring to FIGS. 1-2, a printed circuit board (PCB) 100 includes a base 10, a signal layer 11 lying on the base, and a pair of differential signal traces 12 formed on the signal layer 11. There can be more than one pair of differential signal traces 12 in other embodiments. The PCB 100 may further include other layers and other signal lines, which fall within well-known technologies, and are therefore not described here.

The base 10 is made of a grid of glass fiber bundles filled with epoxy resin.

The pair of differential signal traces 12 includes a first signal trace 121 and a second signal trace 122. Each of the first and second signal traces 121, 122 follows a zigzag pattern.

The first signal trace 121 includes a number of first segments 123. The second signal trace 122 includes a number of second segments 124 connecting to adjacent second segments 124 to form a number of wave troughs A and a number of wave crests B. One wave trough A is positioned between two adjacent wave crests B.

The wave troughs A define a first reference straight line 20 that connects all the wave troughs A of the second signal trace 122. The wave crests B define a second reference straight line 30 that connects all the wave crests B of the second signal trace 122. The acute angles θ between the second segments 124 and the first reference straight line 20 are equal (i.e. the first reference straight line 20, each wave crest B and two corresponding adjacent wave troughs A cooperatively form an isosceles triangle). The distance from each wave crest B to the first reference straight line 20 (i.e. twice of the wave amplitude of the triangular wave) is H, the orthogonal distance of each wave crest B and the adjacent wave trough A along the first reference straight line 20 (i.e. half of the wavelength of the triangular wave) is W. The ratio between the H and W is 1:5, in other words, the ratio between the wave amplitude of the triangular wave and the wavelength of the triangular wave is 1:20. The minimum value of H is 25 mils (1 mil=0.0254 mm), the minimum value of W is 125 mils. The first signal trace 121 is identical to the second signal trace 122, with each first segment 123 having the same length as each second segment 124 and parallel to a corresponding one of the second segments 124.

In another embodiment, the distance H is 50 mils, the distance W is 250 mils.

In yet another embodiment, the distance H is in a range from about 25 mils to about 50 mils, the distance W is in a range from about 125 to about 250 mils.

The PCB 100 can reduce fiber-weave effect, additionally, having the distance H and the distance W at a ratio of 1:5, can save a lot of layout space of the PCB 100.

It will be understood that the above particular embodiments are shown and described by way of illustration only. The principles and the features of the present disclosure may be employed in various and numerous embodiment thereof without departing from the scope of the disclosure as claimed. The above-described embodiments illustrate the scope of the disclosure but do not restrict the scope of the disclosure.

What is claimed is:

1. A printed circuit board (PCB) comprising:
a base, which is made of a grid of glass fiber bundles filled with epoxy resin;
a signal layer lying on the base, and
a plurality of pairs of differential signal traces positioned on the signal layer, wherein each pair of differential signal traces comprises a first signal trace and a second signal trace, each of the first and second signal traces extends in a zigzag pattern, the first signal trace comprises a plurality of wave crests and wave troughs, the wave crests define a reference straight line that connects all the wave crest of the first signal trace, and the ratio of the distance from each wave crest to the reference straight line to the orthogonal distance between each wave crest and an adjacent wave trough along the reference straight line is 1:5, the second signal trace is identical to the first signal trace.

2. The PCB of claim 1, wherein the distance from each wave crest to the reference straight line is 25 mils, the orthogonal distance between each wave crest and an adjacent wave trough along the reference straight line is 125 mils.

3. The PCB of claim 1, wherein the distance from each wave crest to the reference straight line is 50 mils, the orthogonal distance between each wave crest and an adjacent wave trough along the reference straight line is 250 mils.

4. The PCB of claim 1, wherein the distance from each wave crest to the reference straight line is in a range from about 25 mils to about 50 mils, the orthogonal distance between each wave crest and an adjacent wave trough along the reference straight line is in a range from about 125 mils to about 250 mils.

5. The PCB of claim 1, wherein the first signal trace comprises a number of first segments, with each two adjacent first segments being connected to each other end-to-end; the second signal trace comprises a number of second segments, with each two adjacent second segments being connected to each other end-to-end; each first segment has the same length as each second segment and is parallel to a corresponding one of the second segments.

* * * * *